United States Patent
Bagchi et al.

(10) Patent No.: US 11,652,475 B1
(45) Date of Patent: May 16, 2023

(54) INDEPENDENT SKEW CONTROL OF A MULTI-PHASE CLOCK

(71) Applicant: Synopsys, Inc., Mountain View, CA (US)

(72) Inventors: Srirup Bagchi, Kolkata (IN); Gaurav Bhojane, Pune (IN); Ravi Mehta, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/693,176

(22) Filed: Mar. 11, 2022

Related U.S. Application Data

(60) Provisional application No. 63/162,756, filed on Mar. 18, 2021.

(51) Int. Cl.
*H03K 5/135* (2006.01)
*H03M 1/08* (2006.01)
*H03K 5/134* (2014.01)

(52) U.S. Cl.
CPC ............ *H03K 5/135* (2013.01); *H03K 5/134* (2014.07); *H03M 1/0836* (2013.01)

(58) Field of Classification Search
CPC ...... H03K 5/135; H03K 5/134; H03M 1/0836
See application file for complete search history.

(56) References Cited

U.S. PATENT DOCUMENTS

| | | | |
|---|---|---|---|
| 7,496,161 B2* | 2/2009 | Chou ............... | H04L 25/03057 375/344 |
| 7,994,837 B1* | 8/2011 | Ho ..................... | H03H 11/22 327/233 |

* cited by examiner

*Primary Examiner* — Cassandra F Cox
(74) *Attorney, Agent, or Firm* — Weaver Austin Villeneuve & Sampson LLP

(57) ABSTRACT

A circuit includes, in part, a first transistor receiving a first clock signal at its gate, a second transistor receiving a second clock signal at its gate, a first impedance coupled to the drain terminal of the first transistor, a second impedance coupled to the drain terminal of the second transistor, a current source coupled to the source terminals of the first and second transistors, a third transistor receiving a third clock signal at its gate, a fourth transistor receiving a fourth clock signal at its gate, a fifth transistor coupling the drain terminal of the third transistor to the second impedance in response to a first control signal, a sixth transistor coupling the drain terminal of the fourth transistor to the second impedance in response to a second control signal, and a first variable current source coupled to the source terminals of the third and fourth transistors.

20 Claims, 8 Drawing Sheets

INDEPENDENT SKEW CONTROL OF A MULTI-PHASE CLOCK

RELATED APPLICATION

The present application claims benefit under 35 USC 119(e) of U.S. Patent Application No. 63/162,756, filed Mar. 18, 2021, the content of which is incorporated herein by reference in its entirety.

TECHNICAL FIELD

The present application relates to clock control in integrated circuits, and more particularly to independent skew control of a multi-phase clock in high speed serializer/deserializer integrated circuits.

BACKGROUND

A serializer/deserializer (commonly referred to as SerDes) is a circuit used in high speed communications for converting serial data for use in parallel interfaces, and parallel data for use in serial interfaces. A SerDes transmitter generally uses a multi-phase clock to transfer out the serial data. If there is a mismatch between the phases of the clock used for the serial data transfer, the even-odd jitter in the transmitter serial output data will become unacceptably high. A SerDes receiver generally uses a multi-phase clock to slice incoming data in a clock and data recovery loop. A mismatch between the clock phases, causes data slicing to become unreliable due to excessive jitter.

SUMMARY

A circuit, in accordance with one embodiment of the present disclosure, includes, in part, a first transistor having a gate terminal receiving a first clock signal; a second transistor having a gate terminal receiving a second clock signal, wherein the second clock signal has a phase that is shifted by 180° relative to a phase of the first clock signal; a first impedance coupled between a supply voltage and a drain terminal of the first transistor; a second impedance coupled between the supply voltage and a drain terminal of the second transistor; a first current source supplying a substantially fixed current and coupled to a source terminal of each of the first and second transistors; a third transistor having a gate terminal receiving a third clock signal; a fourth transistor having a gate terminal receiving a fourth clock signal, wherein the fourth clock signal has a phase that is shifted by 180° relative to a phase of the third clock signal; a fifth transistor adapted to couple a drain terminal of the third transistor to the second impedance in response to a first control signal; a sixth transistor adapted to couple a drain terminal of the fourth transistor to the second impedance in response to a second control signal; and a first variable current source coupled to a source terminal of each of the third and fourth transistors.

In one embodiment, the third clock signal has a phase that is shifted by 90° relative to the phase of the first clock signal, and the fourth clock signal has a phase that is shifted by 270° relative to the phase of the first clock signal. In one embodiment, the second control signal has a phase that is shifted by 180° relative to a phase of the first control signal. In one embodiment, the first control signal and the current supplied by the first variable current source are used to delay a phase of a first output clock signal generated at a drain terminal of the second transistor.

In one embodiment, the second control signal and the current supplied by the first variable current source are used to advance the phase of the first output clock. In one embodiment, the circuit further includes, in part, a seventh transistor adapted to couple the drain terminal of the third transistor to the supply voltage in response to the second control signal; and an eighth transistor adapted to couple the drain terminal of the fourth transistor to the supply voltage in response to the first control signal.

In one embodiment, the circuit further includes, in part, a ninth transistor having a gate terminal receiving the third clock signal; a tenth transistor having a gate terminal receiving the fourth clock signal; an eleventh transistor adapted to couple a drain terminal of the ninth transistor to the first impedance in response to a third control signal; a twelfth transistor adapted to couple a drain terminal of the tenth transistor to the first impedance in response to a fourth control signal; and a second variable current source coupled to a source terminal of each of the eleventh and twelfth transistors.

In one embodiment, the third control signal and the current supplied by the second variable current source are used to advance a phase of a second output clock signal generated at a drain terminal of the first transistor. In one embodiment, the fourth control signal and the current supplied by the second variable current source are used to delay the phase of the second output clock signal. In one embodiment, the circuit further includes, in part, a thirteenth transistor adapted to couple the drain terminal of the ninth transistor to the supply voltage in response to the fourth control signal; and a fourteenth transistor adapted to couple the drain terminal of the tenth transistor to the supply voltage in response to the fourth control signal. In one embodiment, each of the fifth, sixth, seventh, eighth, eleventh, twelfth, thirteenth and fourteenth transistors are PMOS transistors. In one embodiment, the first, second, third and fourth clock signals represent different phases of a same clock.

A non-transitory computer readable medium, in accordance with one embodiment of the present disclosure, includes, in part, stored instructions which when executed by a processor cause the processor to generate data representative a first transistor having a gate terminal receiving a first clock signal; generate data representative of a second transistor having a gate terminal receiving a second clock signal, wherein the second clock signal has a phase that is shifted by 180° relative to a phase of the first clock signal; generate data representative of a first impedance coupled between a supply voltage and a drain terminal of the first transistor; generate data representative of a second impedance coupled between the supply voltage and a drain terminal of the second transistor; generate data representative of a first current source supplying a substantially fixed current and coupled to a source terminal of each of the first and second transistors; generate data representative of a third transistor having a gate terminal receiving a third clock signal; generate data representative of a fourth transistor having a gate terminal receiving a fourth clock signal, wherein the fourth clock signal has a phase that is shifted by 180° relative to a phase of the third clock signal; generate data representative of a fifth transistor adapted to couple a drain terminal of the third transistor to the second impedance in response to a first control signal; generate data representative of a sixth transistor adapted to couple a drain terminal of the fourth transistor to the second impedance in response to a second control signal; and generate data representative of a first variable current source coupled to a source terminal of each of the third and fourth transistors.

In one embodiment, the non-transitory computer readable medium the third clock signal has a phase that is shifted by 90° relative to the phase of the first clock signal, and the fourth clock signal has a phase that is shifted by 270° relative to the phase of the first clock signal. In one embodiment, the second control signal has a phase that is shifted by 180° relative to a phase of the first control signal. In one embodiment, the first control signal and the current supplied by the first variable current source are used to delay a phase of a first output clock signal generated at a drain terminal of the second transistor. In one embodiment, the second control signal and the current supplied by the first variable current source are used to advance the phase of the first output clock.

In one embodiment, the instructions further cause the processor to generate data representative of a seventh transistor adapted to couple the drain terminal of the third transistor to the supply voltage in response to the second control signal; and generate data representative of an eighth transistor adapted to couple the drain terminal of the fourth transistor to the supply voltage in response to the first control signal.

In one embodiment, the instructions further cause the processor to generate data representative of a ninth transistor having a gate terminal receiving the third clock signal; generate data representative of a tenth transistor having a gate terminal receiving the fourth clock signal; generate data representative of an eleventh transistor adapted to couple a drain terminal of the ninth transistor to the first impedance in response to a third control signal; generate data representative of a twelfth transistor adapted to couple a drain terminal of the tenth transistor to the first impedance in response to a fourth control signal; and generate data representative of a second variable current source coupled to a source terminal of each of the eleventh and twelfth transistors. In one embodiment, the third control signal and the current supplied by the second variable current source are used to advance a phase of a second output clock signal generated at a drain terminal of the first transistor.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Mismatches between the phases of a clock used in serial transfer of data in a communication circuit, such as a SerDes, result in excessively high jitter and unreliability in data slicing. One known technique for mitigating mismatches between phases of a clock is to increase or decrease the rise/fall times of the clock. However, existing techniques for controlling a clock phase consume a relatively large amount of power, and achieve a relatively small phase delay range. In accordance with embodiments of the present disclosure, phases of a clock are independently controlled to mitigate mismatches between the phases. Embodiments of the present disclosure provide a number of advantages, such as relatively low power consumption, enhanced delay range, and variable delay step size.

Figure 1:
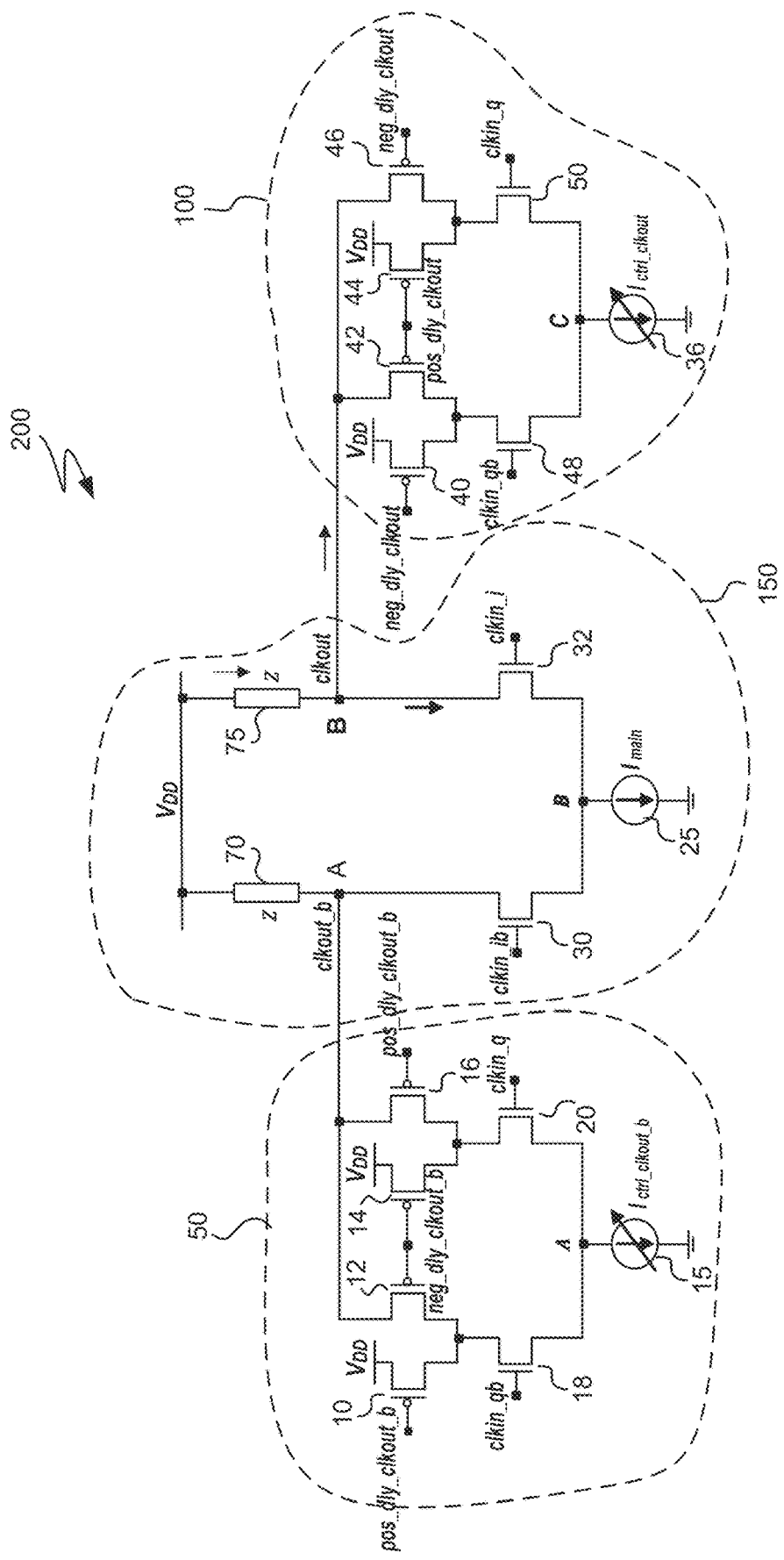
FIG. 1 is a transistor schematic diagram of a multi-phase clock control circuit, in accordance with one embodiment of the present disclosure.

FIG. 1 is a transistor schematic diagram of a multi-phase clock control circuit 200, in accordance with one embodiment of the present disclosure. Multi-phase clock control circuit 200 is shown as including a first phase interpolation circuit 50, a second phase interpolation circuit 100, and a clock phase generation circuit 150. As is described in detail below, multi-phase clock control circuit 200 is adapted to control phases of clock signals clkout and clkout_b independently by interpolating the phases of clock signals clkin_i or clkin_ib with the phases of clock signals clkin_q or clkin_qb using the weights provided by variable current sources $I_{ctr\_clkout}$ 30 and $I_{ctrl\_clkout\_b}$ 15.

Clock phase generation circuit 150 is shown as including, in part, NMOS transistors 30 and 32 that receive complementary clock signals clkin_i and clkin_ib at their respective gate terminals. Clock phase generation circuit 150 is also shown as including impedances 70, 75 (resistive elements), as well as current source 25 adapted to generate a substantially constant current $I_{main}$.

Phase interpolation circuit 50 is shown as including, in part, NMOS transistors 20 and 18 that receive complementary clock signals clkin_q and clkin_qb at their respective gate terminals. Phase interpolation circuit 50 is also shown as including, in part, PMOS transistor 10 that couples the drain terminal of transistor 18 to supply voltage $V_{DD}$, PMOS transistor 12 that couples the drain terminal of transistor 18 to node A supplying clock signal clkout_b, PMOS transistor 14 that couples the drain terminal of transistor 20 to supply voltage $V_{DD}$, PMOS transistor 16 that couples the drain terminal of transistor 16 to node A, and variable current source 15 adapted to supply a variable current $I_{ctrl\_clkout\_b}$.

Phase interpolation circuit 100 is shown as including, in part, NMOS transistors 50 and 48 that receive complementary clock signals clkin_q and clkin_qb at their respective gate terminals. Phase interpolation circuit 150 is also shown as including, in part, PMOS transistor 40 that couples the drain terminal of transistor 48 to supply voltage $V_{DD}$, PMOS transistor 42 that couples the drain terminal of transistor 48 to node B supplying clock signal clkout, PMOS transistor 44 that couples the drain terminal of transistor 50 to supply voltage $V_{DD}$, PMOS transistor 46 that couples the drain terminal of transistor 50 to node B, and variable current source 30 adapted to supply a variable current $I_{ctrl\_clkout}$.

Transistors 42 and 44 receive signal pos_dly_clkout at their gate terminals. The complement of signal pos_dly_clkout, namely signal neg_dly_clkout, is applied to the gate terminals of transistors 40 and 46. Transistors 10 and 16 receive signal pos_dly_clkout_b at their gate terminals. The complement of signal pos_dly_clkout_b, namely signal neg_dly_clkout_b, is applied to the gate terminals of transistors 12 and 14.

Signals pos_dly_clkout, pos_dly_clkout_b, neg_dly_clkout, and neg_dly_clkout_b are rail-to-rail voltages that vary between the ground potential and the supply voltage $V_{DD}$. As is described further below, the phase of clock signal clkout_b is controlled, in part, by phase interpolation circuit 50. Similarly, the phase of clock signal clkout is controlled, in part, by phase interpolation circuit 100. Accordingly, embodiments of the present disclosure provide independent control of clock signals clkout and clkout_b.

When signal pos_dly_clkout_b is low, part of the current flowing through impedance 70 flows through transistors 16 and 20, thereby causing the delay (i.e., the phase) of clock signal clkout_b to be set in accordance with clock signal clkin_q and the current $I_{ctrl\_clkout\_b}$. Similarly, when signal neg_dly_clkout_b is low, part of the current flowing through impedance 70 flows through transistors 12 and 18, thereby causing the phase of clock signal clkout_b to be set in accordance with clock signal clkin_qb and the current $I_{ctrl\_clkout\_b}$. Therefore, the phase of clock signal clkout_b may be varied either through interpolation with signal clkin_q using the weight provided by the current flowing through current source 15, or through interpolation with clock signal clkin_qb using the weight provided by the current flowing through current source 15. In other words, embodiments of the present disclosure enable bi-directional change in the phase of clock signal clkout_b by either advancing clock signal clkout_b using signal neg_dly_clkout_b and variable current/dr/clkout_b, or delaying clock signal clkout_b using signal pos_dly_clkout_b and variable current $I_{ctrl\_clkout\_b}$.

In a similar manner, the phase of clock signal clkout may be varied either through interpolation with clock signal clkin_q using the weight provided by the current flowing through current source 30, or through interpolation with clock signal clkin_qb using the weight provided by the current flowing through current source 15. In other words, the phase of clock signal clkout may be advanced using clock signal neg_dly_clkout and variable current $I_{ctrl\_clkout}$, or delayed using signal pos_dly_clkout and variable current $I_{ctrl\_clkout\_b}$.

The following description is provided with reference to clock signal clkin_q having a 90° phase shift with respect to clock signal clkin_i, and clock signal clkin_qb having a 270° phase shift with respect to clock signal clkin_i. As was described above, clock signal clkin_ib has a 180° phase shift with respect to clock signal clkin_i. It is understood, however, that in other embodiments, clock signals clkin_q and clkin_qb may have other differential phases relative to phases of complementary clock signals clkin_i and clkin_ib.

Assume a pair of clock signals clkin_0 and clkin_90 that have a 90° phase shift with respect to one another, as represented below:

$$clkin\_0 = A\cos(\omega T) \tag{1}$$

$$clkin\_90 = A\sin(\omega T) \tag{2}$$

By applying different weights to clock signals clkin_0 and clkin_90 and adding them together, a clock signal clk may be generated, as defined below:

$$clk = (1-\alpha)*clkin\_0 + \alpha*clkin\_90 \tag{3}$$

where parameters "A" and "ω" respectively represent the amplitude and frequency of the clocks, parameter "a" is the weight applied to clkin_0, and parameter "1–a" is the weight applied to clkin_90.

Therefore, signal clk may defined as:

$$clk = A\sqrt{a^2 + (1-a)^2} * \cos\left(\omega t + \tan^{-1}\left(\frac{a}{1-a}\right)\right) \tag{4}$$

As seen from expression (4), by changing the value of parameter "a", the phase of clock signal clk may be varied from 0° to 90° relative to the phase of clock signal clkin_0.

Referring to FIG. 1, quadrature phase clock signal clkin_i, clkin_q, clkin_ib and clkin_qb may be represented as:

$$clkin_i = V_{CM} + A\cos(\omega t) \tag{5}$$

$$clkin_q = V_{CM} + A\cos\left(\omega t - \frac{\pi}{2}\right) \tag{6}$$

$$clkin_{ib} = V_{CM} + A\cos(\omega t - \pi) \tag{7}$$

$$clkin_{qb} = V_{CM} + A\cos\left(\omega t - \frac{3\pi}{2}\right) \tag{8}$$

where parameter "$V_{CM}$" represents the average of the DC voltage levels of the 4 clock signals, parameter "A" represents their amplitudes, and parameter "ω" represents their frequency.

To delay signal clkout, in one embodiment, signal pos_dly_clkout is set to a low level, signal neg_dly_clkout is set to a high level, and variable current Ictrl_clkout is increased. This causes an incremental change in current i_1 flowing through transistor 32, and an incremental change in current i_2 flowing through transistor 48. Current i_1 and i_2 may be defined as:

$$i\_1 = g\_m1 * A\cos(\omega t) \tag{9}$$

$$i\_2 = g\_m2 * A\sin(\omega t) \tag{10}$$

In expression (9), parameter g_m1 may be defined as:

$$g\_m1 = \sqrt{I\_main * \mu * Cox * W\_1/L\_1} \tag{11}$$

In expression (11), I_main represents the sum of the DC current levels flowing through transistors 32, 34, μ is the mobility of the electrons, Cox represents the gate oxide capacitance, and W_1/L_1 represents the ratio of the channel-width to channel-length ratio of either transistors 30 or 32.

In expression (10), parameter g_m2 may be defined as:

$$g\_m2 = \sqrt{I\_ctrl\_clkout * \mu * Cox * W\_2/L\_2} \tag{12}$$

In expression (12), parameter I_ctrl_clkout represents the sum of the DC current levels flowing through transistors 48, 50, μ is the mobility of the electrons, Cox represents the gate oxide capacitance, and W_2/L_2 represents the ratio of the channel-width to channel-length ratio of either transistors 48 or 50.

The current I_clkout flowing through impedance 75 may thus be defined as:

$$I\_clkout = \frac{I\_main}{2} + \frac{I\_ctrl\_clkout}{2} + i\_tot \quad (13)$$

where $i\_tot = i\_1 + i\_2$

The current flowing through transistor 32 may thus be defined as:

$$\frac{I\_main}{2} + i\_tot$$

The current flowing from node B to phase interpolation circuit 100 may therefore be defined as:

$$\frac{I\_ctrl\_clkout}{2} + i\_2$$

Current i_tot may then be defined as:

$$i\_tot = A\cos(\omega t - \tan^{-1}(g\_m2/g\_m1)) \quad (14)$$

Equation (14) may be written as:

$$i_{tot} = A\cos\left(wt - \tan^{-1}\sqrt{((I\_ctrl\_clkout \times W\_2/L\_2)/(I\_main \times -W\_1/L\_1))}\right) \quad (15)$$

Equation (15) may be written as:

$$i_{tot} = A\cos\left(wt - \tan^{-1}\left(k \times \sqrt{\frac{I\_ctrl\_clkout}{I\_main}}\right)\right) \quad (16)$$

where $k$ represents $\sqrt{\frac{W\_2/L\_2}{W\_1/L\_1}}$ (17)

The average DC voltage level of the clock signal clkout may therefore be written as:

$$VDD - Z \times (I\_main/2 + I\_ctr\_clkout/2) \quad (18)$$

where z is the impedance of either impedance 70 or 75.

As is seen from above equations, by varying current I_ctr_clkout, the phase of clock signal clkout may be changed. In a similar manner, by setting signal pos_dly_clkout to a high level, and setting signal neg_dly_clkout to a low level, the phase of the clock signal clkout may be advanced by increasing the current I_ctr_clkout. Therefore, the phase of the clock signal clkout may be changed either through transistors 46 and 50, or though transistors 42 and 48, and varying current I_ctr_clkout. In a similar manner, the phase of the clock signal clkout_b may be changed either through transistors 12 and 18, or though transistors 16 and 20, and varying current I_ctr_clkout_b.

Figure 2:
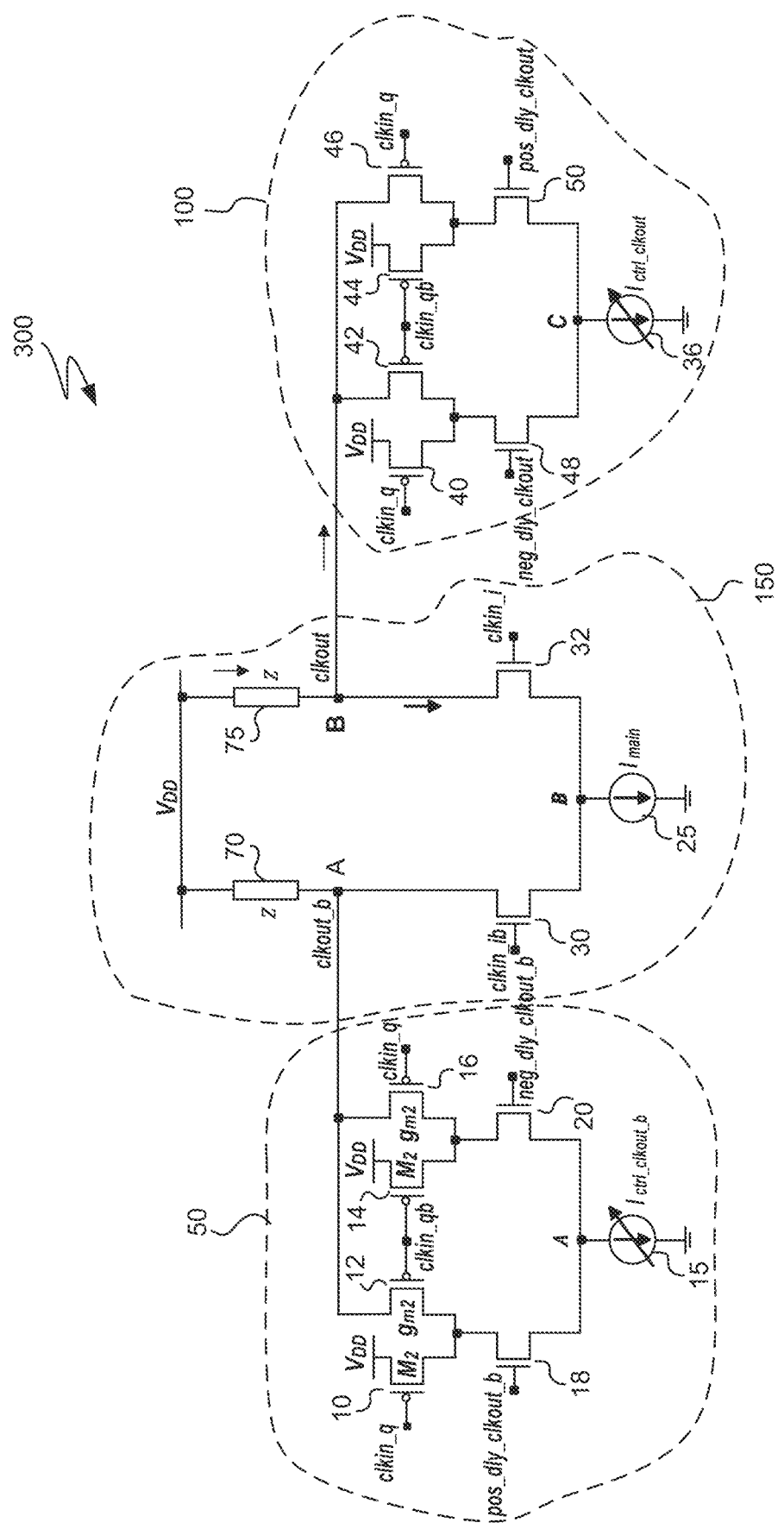
FIG. 2 is a transistor schematic diagram of a multi-phase clock control circuit, in accordance with another embodiment of the present disclosure.

FIG. 2 is a transistor schematic diagram of a multi-phase clock control circuit 300, in accordance with another embodiment of the present disclosure. Multi-phase clock control circuit 300 is similar to multi-phase clock control circuit 200 except the following. In multi-phase clock control circuit 300, transistors 18 and 20, shown as respectively receiving signals pos_dly_clkout_b and neg_dly_clkout_b at their gate terminals, are coupled to current source 15 at their source terminals. Transistors 10 and 16, shown as receiving clock signal clkin_q at their gate terminals and coupled to node A at their drain terminals, are NMOS transistors. Transistors 12, 14, shown as receiving clock signal clkin_qb at their gate terminals and coupled to node A at their drain terminals, are also NMOS transistors.

In a similar manner, transistors 50 and 48, shown as respectively receiving signals pos_dly_clkout and neg_dly_clkout at their gate terminals, are coupled to current source 30 at their source terminals. Transistors 40 and 46, shown as receiving clock signal clkin_q at their gate terminals and coupled to node B at their drain terminals, are NMOS transistors. Transistors 42, 44, shown as receiving clock signal clkin_qb at their gate terminals and coupled to node B at their drain terminals, are also NMOS transistors.

Figure 3:
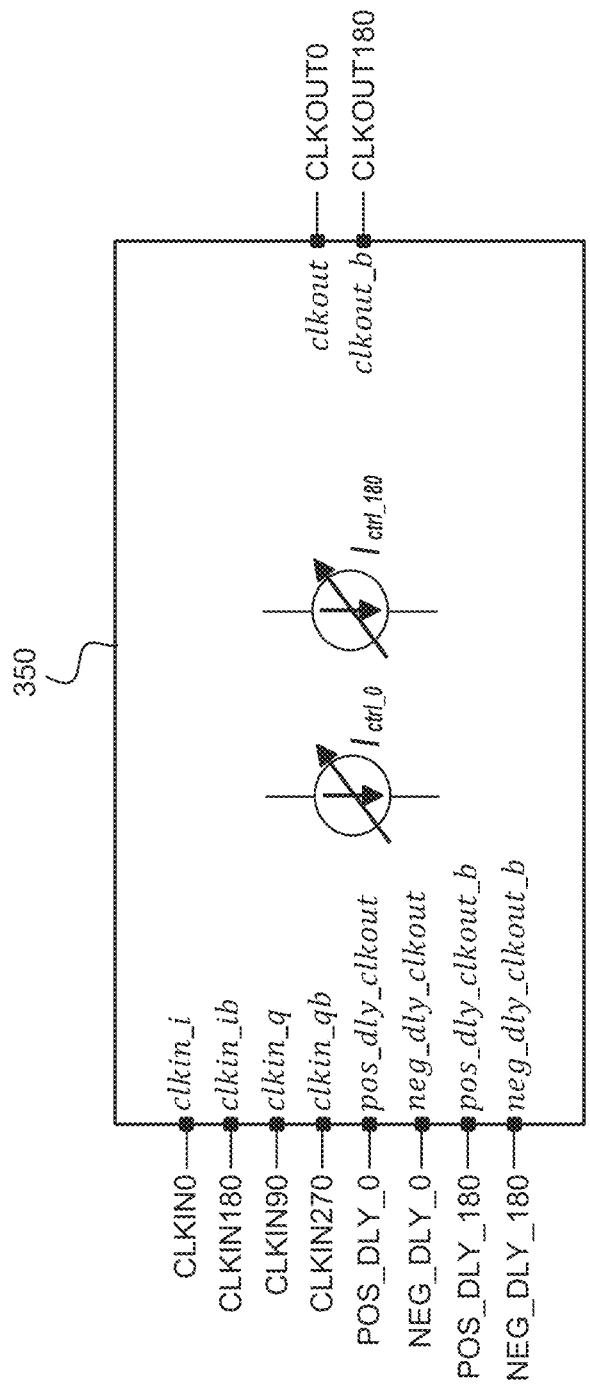
FIG. 3 is a block diagram of the multi-phase clock control circuit of FIG. 1 or 2, in accordance with one embodiment of the present disclosure.

FIG. 3 is a block diagram 350 of multi-phase clock control circuit 200 shown in FIG. 1. Signals CLKIN0, CLKIN180, CLKIN90, and CLKIN270, applied respectively to input terminals clkin_i, clkin_ib, clkin_q and clkin_qb of block 350, represent 0°, 180°, 90°, and 270° phases of a clock signal. Signals POS_DLY_0 and NEG_DLY_0, applied respectively to input terminals pos_dly_clkout and neg_dly_clkout of block 350 are inverse of one another. Similarly, signals POS_DLY_180 and NEG_DLY_180, applied respectively to input terminals pos_dly_clkout_b and neg_dly_clkout_b of block 350 are inverse of one another. Current source $I_{ctrl\_0}$ and $I_{ctrl\_180}$ represent current sources 25 and 30 shown in FIG. 1.

Figure 4:
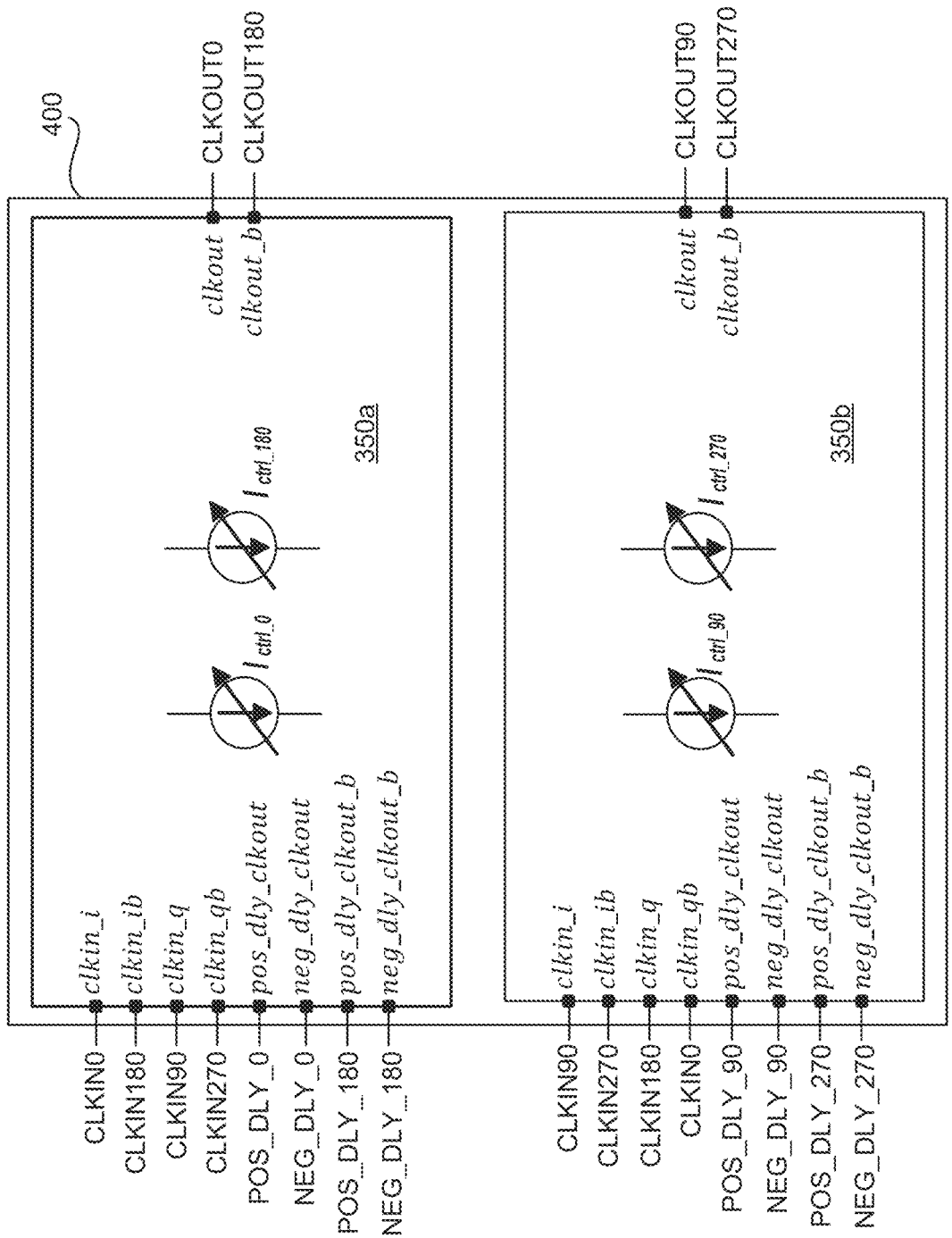
FIG. 4 is a block diagram showing two instantiations of the circuit of FIG. 1 to generate four independently controlled phases of a clock, in accordance with one embodiment of the present disclosure

FIG. 4 is a block diagram 400 of a circuit which uses quadrature phases of a clock to advance or delay clock phases. Multi-phase clock control circuit 400 is shown as including two instantiations 350a and 350b of multi-phase clock control circuit block 350 shown in FIG. 3. Instantiation 350a is described above with reference to FIGS. 1 and/or 2. In instantiation 350b, signals CLKIN90, CLKIN270, CLKIN180, and CLKIN0, applied respectively to input terminals clkin_i, clkin_ib, clkin_q and clkin_qb, represent 90°, 270°, 180°, and 0° phases of an input clock signal. Signals POS_DLY_90 and NEG_DLY_90, applied respectively to input terminals pos_dly_clkout and neg_dly_clkout are inverse of one another representing complementary signals. Similarly, signals POS_DLY_270 and NEG_DLY_270, applied respectively to input terminals pos_dly_clkout_b and neg_dly_clkout_b are inverse of one another. Current source $I_{ctrl\_90}$ and $I_{ctrl\_270}$ represent current sources 25 and 30 shown in FIG. 1.

Multi-phase clock control circuit 400 uses quadrature phases of a clock to enable generation of independently controlled clock phases CLKOUT0, CLKOUT180, CLKOUT90, and CLKOUT270. Current source $I_{ctrl\_0}$, $I_{ctrl\_180}$, $I_{ctrl\_90}$, and $I_{ctrl\_270}$ are respectively used to control the four phases of the output clock, namely CLKOUT0, CLKOUT180, CLKOUT90, and CLKOUT270. Signals POS_DLY_0 and NEG_DLY_0 may be used to respectively delay or advance the phase of signal CLKOUT0. Signals POS_DLY_90 and NEG_DLY_90 may be used to respectively delay or advance the phase of signal CLKOUT90. Signals POS_DLY_180 and NEG_DLY_180 may be used to respectively delay or advance the phase of signal CLKOUT180. Signals POS_DLY_270 and NEG_DLY_270 may be used to respectively delay or advance the phase of the signal CLKOUT270.

Figure 5:
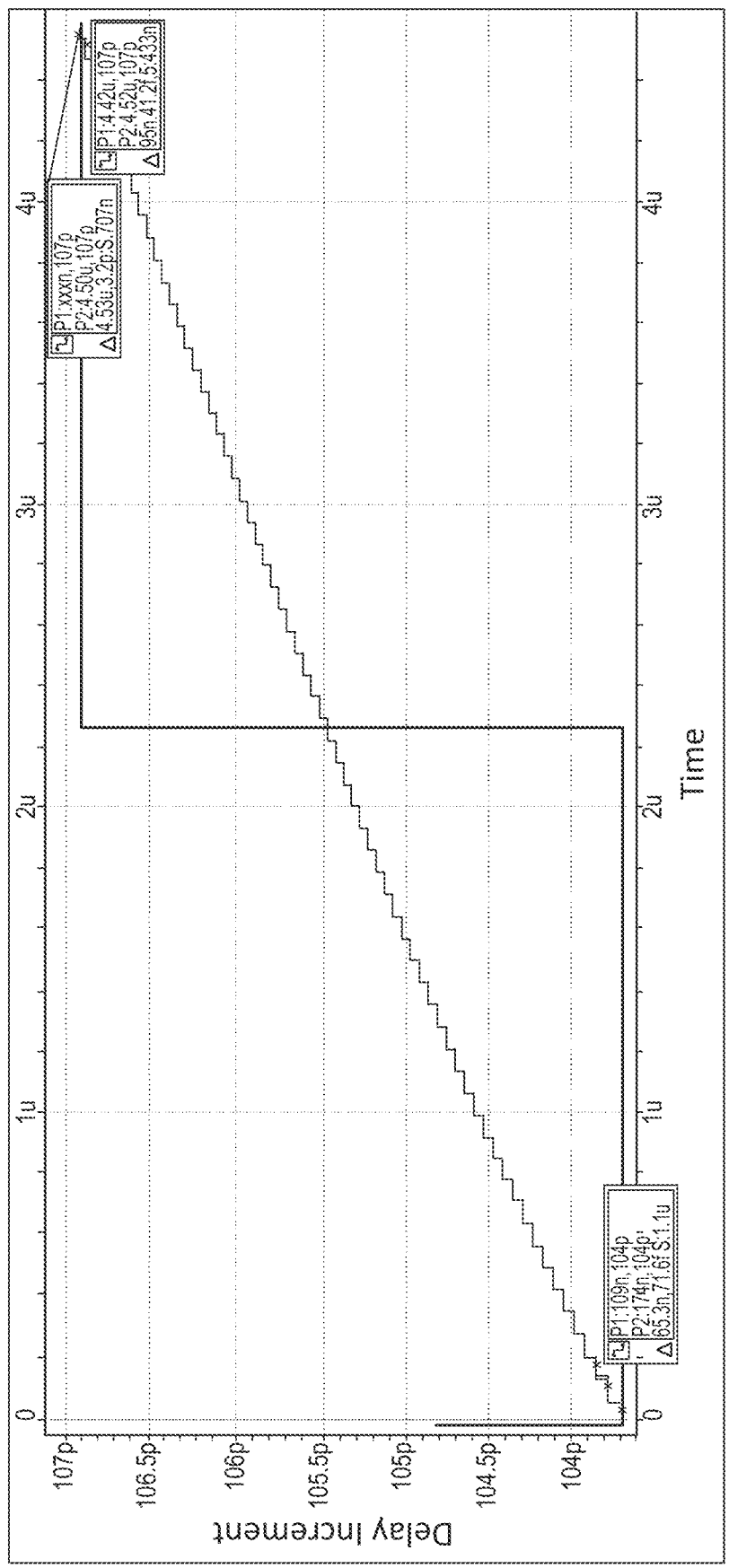
FIG. 5 is an exemplary computer simulation of the circuit shown in FIG. 1, in accordance with one embodiment of the present disclosure.

FIG. 5 is an exemplary computer simulation result showing the delay of the phase of an output clock, such as output clock signal clkout as generated by the circuit shown in FIG. 1, in accordance with one embodiment of the present disclosure. As is seen from FIGS. 5 and 1, by increasing the current generated by current source 30 and setting signal pos_dly_clkout to a low supply voltage level, the phase of the output clock signal clkout is increased. In the example of FIG. 5, the phase of the clock signal is shown as being changed by a maximum (range) of 3.4 picoseconds (ps). The minimum phase delay step-size is shown as being 34 femtoseconds (fs), and the maximum phase delay step size is shown as being 84 fs. The maximum phase delay (shown as being 3.4 ps) of signal clockout is dependent on the maximum value of the current source 30. The phase delay step-size depends on the step-sizes by which current source 30 can be increased or decreased.

Figure 6:
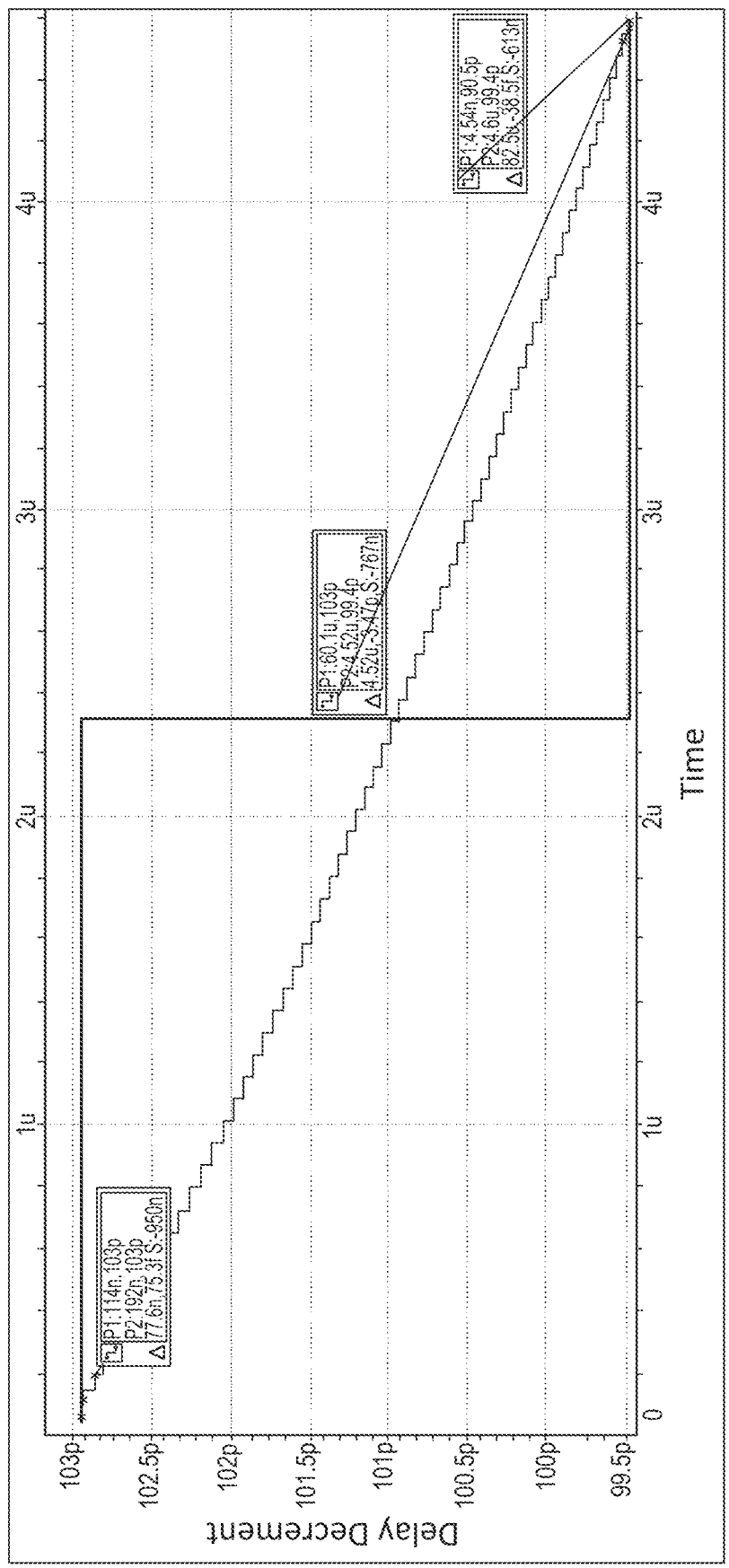
FIG. 6 is an exemplary computer simulation of the circuit shown in FIG. 1, in accordance with one embodiment of the present disclosure FIG. 7 shown a flowchart of various processes used during the design and manufacture of an integrated circuit in accordance with some embodiments of the present disclosure.

FIG. 6 is an exemplary computer simulation result showing the advancement of the phase of an output clock, such as output clock signal clkout as generated by the circuit shown in FIG. 1, in accordance with one embodiment of the present disclosure. As is seen from FIGS. 6 and 1, by increasing the current generated by current source 30 and setting signal neg_dly_clkout to a low supply voltage level, the phase of the output clock signal clkout is decreased. In the example of FIG. 6, the phase of the clock signal is shown as being changed by a maximum of 3.1 ps. The minimum phase change step-size is shown as being 34 femtoseconds (fs), and the maximum phase change step size is shown as being 78 fs. The maximum phase change of 3.1 ps of signal clockout is dependent on the maximum value of the current source 30. The phase delay step-size depends on the step-sizes by which current source 30 can be increased or decreased.

Figure 7:
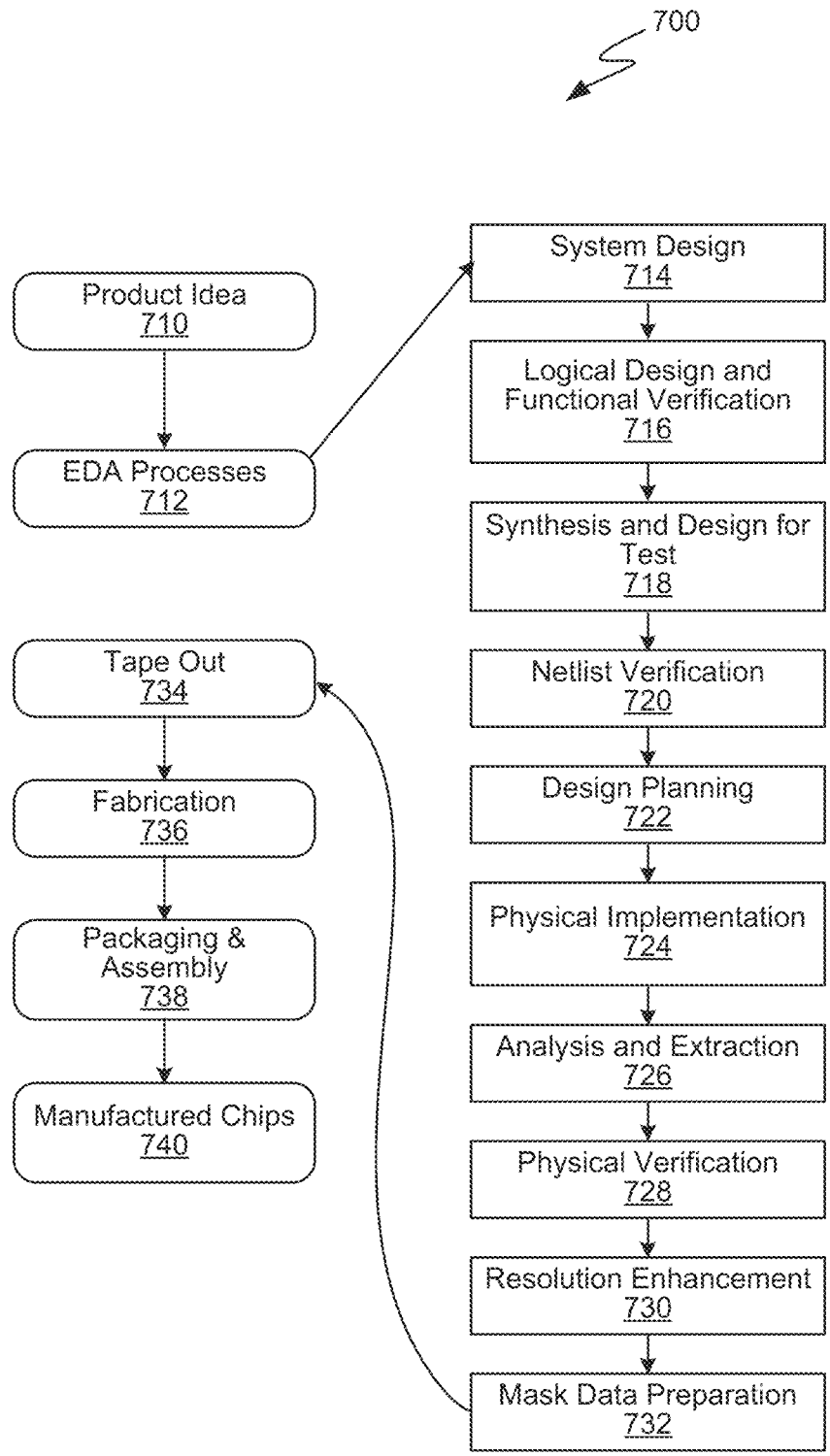

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 7) may be used to store the programs and data structures that are used by some or all of the EDA products described herein, and products used for development of cells for the library and for physical and logical design that use the library.

Figure 8:
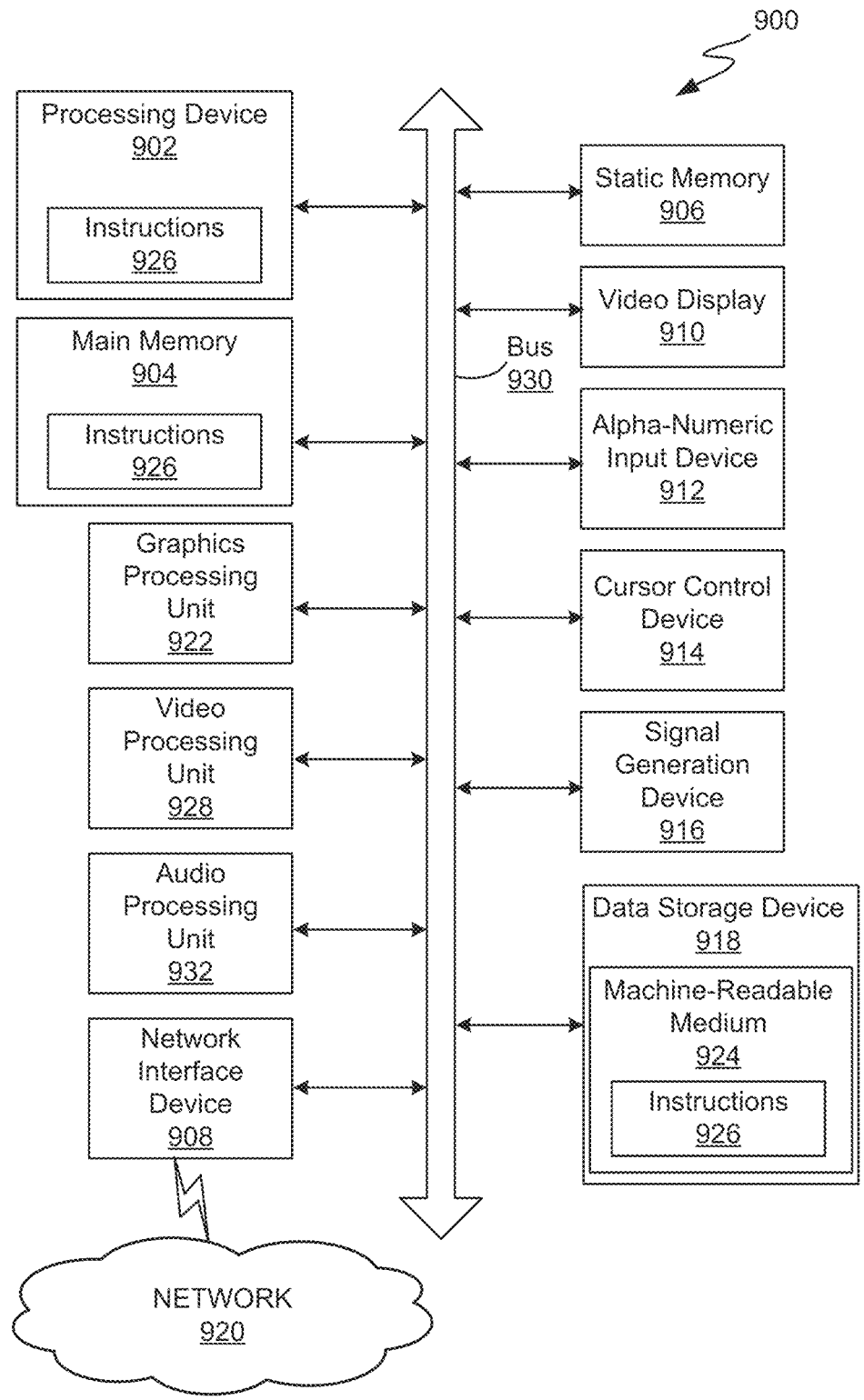
FIG. 8 shows an exemplary computer system in which embodiments of the present disclosure may operate.

FIG. 8 illustrates an example of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A circuit comprising:
a first transistor having a gate terminal receiving a first clock signal;
a second transistor having a gate terminal receiving a second clock signal, wherein the second clock signal has a phase that is shifted by 180° relative to a phase of the first clock signal;
a first impedance coupled between a supply voltage and a drain terminal of the first transistor;
a second impedance coupled between the supply voltage and a drain terminal of the second transistor;
a first current source supplying a substantially fixed current and coupled to a source terminal of each of the first and second transistors;
a third transistor having a gate terminal receiving a third clock signal;
a fourth transistor having a gate terminal receiving a fourth clock signal, wherein the fourth clock signal has a phase that is shifted by 180° relative to a phase of the third clock signal;
a fifth transistor adapted to couple a drain terminal of the third transistor to the second impedance in response to a first control signal;
a sixth transistor adapted to couple a drain terminal of the fourth transistor to the second impedance in response to a second control signal; and
a first variable current source coupled to a source terminal of each of the third and fourth transistors.

2. The circuit of claim 1 wherein the third clock signal has a phase that is shifted by 90° relative to the phase of the first clock signal, and the fourth clock signal has a phase that is shifted by 270° relative to the phase of the first clock signal.

3. The circuit of claim 2 wherein the second control signal has a phase that is shifted by 180° relative to a phase of the first control signal.

4. The circuit of claim 3 wherein the first control signal and the current supplied by the first variable current source are used to delay a phase of a first output clock signal generated at a drain terminal of the second transistor.

5. The circuit of claim 4 wherein the second control signal and the current supplied by the first variable current source are used to advance the phase of the first output clock.

6. The circuit of claim 5 further comprising:
a seventh transistor adapted to couple the drain terminal of the third transistor to the supply voltage in response to the second control signal; and
an eighth transistor adapted to couple the drain terminal of the fourth transistor to the supply voltage in response to the first control signal.

7. The circuit of claim 6 further comprising:
a ninth transistor having a gate terminal receiving the third clock signal;
a tenth transistor having a gate terminal receiving the fourth clock signal;
an eleventh transistor adapted to couple a drain terminal of the ninth transistor to the first impedance in response to a third control signal;
a twelfth transistor adapted to couple a drain terminal of the tenth transistor to the first impedance in response to a fourth control signal; and
a second variable current source coupled to a source terminal of each of the eleventh and twelfth transistors.

8. The circuit of claim 7 wherein the third control signal and the current supplied by the second variable current source are used to advance a phase of a second output clock signal generated at a drain terminal of the first transistor.

9. The circuit of claim 8 wherein the fourth control signal and the current supplied by the second variable current source are used to delay the phase of the second output clock signal.

10. The circuit of claim 9 further comprising:
a thirteenth transistor adapted to couple the drain terminal of the ninth transistor to the supply voltage in response to the fourth control signal; and
a fourteenth transistor adapted to couple the drain terminal of the tenth transistor to the supply voltage in response to the fourth control signal.

11. The circuit of claim 10 wherein each of the fifth, sixth, seventh, eighth, eleventh, twelfth, thirteenth and fourteenth transistors are PMOS transistors.

12. The circuit of claim 7 wherein the first, second, third and fourth clock signals represent different phases of a same clock.

13. A non-transitory computer readable medium comprising stored instructions which when executed by a processor cause the processor to:
generate data representative a first transistor having a gate terminal receiving a first clock signal;
generate data representative of a second transistor having a gate terminal receiving a second clock signal, wherein the second clock signal has a phase that is shifted by 180° relative to a phase of the first clock signal;
generate data representative of a first impedance coupled between a supply voltage and a drain terminal of the first transistor;
generate data representative of a second impedance coupled between the supply voltage and a drain terminal of the second transistor;

generate data representative of a first current source supplying a substantially fixed current and coupled to a source terminal of each of the first and second transistors;

generate data representative of a third transistor having a gate terminal receiving a third clock signal;

generate data representative of a fourth transistor having a gate terminal receiving a fourth clock signal, wherein the fourth clock signal has a phase that is shifted by 180° relative to a phase of the third clock signal;

generate data representative of a fifth transistor adapted to couple a drain terminal of the third transistor to the second impedance in response to a first control signal;

generate data representative of a sixth transistor adapted to couple a drain terminal of the fourth transistor to the second impedance in response to a second control signal; and generate data representative of a first variable current source coupled to a source terminal of each of the third and fourth transistors.

14. The non-transitory computer readable medium of claim 13 wherein the third clock signal has a phase that is shifted by 90° relative to the phase of the first clock signal, and the fourth clock signal has a phase that is shifted by 270° relative to the phase of the first clock signal.

15. The non-transitory computer readable medium of claim 14 wherein the second control signal has a phase that is shifted by 180° relative to a phase of the first control signal.

16. The non-transitory computer readable medium of claim 15 wherein the first control signal and the current supplied by the first variable current source are used to delay a phase of a first output clock signal generated at a drain terminal of the second transistor.

17. The non-transitory computer readable medium of claim 16 wherein the second control signal and the current supplied by the first variable current source are used to advance the phase of the first output clock.

18. The non-transitory computer readable medium of claim 17 wherein the instructions further cause the processor to:

generate data representative of a seventh transistor adapted to couple the drain terminal of the third transistor to the supply voltage in response to the second control signal; and generate data representative of an eighth transistor adapted to couple the drain terminal of the fourth transistor to the supply voltage in response to the first control signal.

19. The non-transitory computer readable medium of claim 18 wherein the instructions further cause the processor to:

generate data representative of a ninth transistor having a gate terminal receiving the third clock signal;

generate data representative of a tenth transistor having a gate terminal receiving the fourth clock signal;

generate data representative of an eleventh transistor adapted to couple a drain terminal of the ninth transistor to the first impedance in response to a third control signal;

generate data representative of a twelfth transistor adapted to couple a drain terminal of the tenth transistor to the first impedance in response to a fourth control signal; and generate data representative of a second variable current source coupled to a source terminal of each of the eleventh and twelfth transistors.

20. The non-transitory computer readable medium of claim 19 wherein the third control signal and the current supplied by the second variable current source are used to advance a phase of a second output clock signal generated at a drain terminal of the first transistor.

* * * * *